United States Patent [19]
Hsu et al.

[11] Patent Number: 6,144,081
[45] Date of Patent: *Nov. 7, 2000

[54] METHOD TO SUPPRESS SUBTHRESHOLD LEAKAGE DUE TO SHARP ISOLATION CORNERS IN SUBMICRON FET STRUCTURES

[75] Inventors: Louis Lu-Chen Hsu; Chang-Ming Hsieh, both of Fishkill; Lyndon Ronald Logan, Wappingers Falls; Jack Allan Mandelman, Stormville; Seiki Ogura, Hopewell Junction, all of N.Y.

[73] Assignee: International Business Machines Corporation, Armonk, N.Y.

[ * ] Notice: Under 35 U.S.C. 154(b), the term of this patent shall be extended for 1057 days.

[21] Appl. No.: 08/540,961

[22] Filed: Oct. 11, 1995

Related U.S. Application Data

[63] Continuation of application No. 08/274,055, Jul. 12, 1994, abandoned.

[51] Int. Cl.[7] .......................... H01L 29/76; H01L 29/94; H01L 31/062; H01L 31/113
[52] U.S. Cl. ............................................ 257/397; 257/401
[58] Field of Search .................................... 257/401, 394, 257/395, 396, 397

[56] References Cited

U.S. PATENT DOCUMENTS

| | | | |
|---|---|---|---|
| 4,635,090 | 1/1987 | Tamaki et al. | 357/50 |
| 4,728,622 | 3/1988 | Kamata | 437/44 |
| 4,975,754 | 12/1990 | Ishiuchi et al. | 357/23.4 |
| 5,248,894 | 9/1993 | Beasom | 257/519 |
| 5,250,837 | 10/1993 | Sparks | 257/519 |
| 5,275,965 | 1/1994 | Manning | 437/67 |
| 5,466,623 | 11/1995 | Shimizu et al. | 437/52 |
| 5,494,857 | 2/1996 | Cooperman et al. | 437/228 |
| 5,506,160 | 4/1996 | Chang | 437/43 |
| 5,525,530 | 6/1996 | Watabe | 437/34 |

FOREIGN PATENT DOCUMENTS

| | | | |
|---|---|---|---|
| 0445471 | 12/1990 | European Pat. Off. | H01L 21/76 |
| 0600437 | 6/1994 | European Pat. Off. | 257/401 |
| 60-81867 | 5/1985 | Japan | 257/401 |
| 61-19174 | 1/1986 | Japan | 257/401 |
| 2-68963 | 3/1990 | Japan | 257/401 |
| 4-130774 | 5/1992 | Japan | 257/401 |
| 6-53493 | 2/1994 | Japan | 257/401 |
| 6-61481 | 3/1994 | Japan | 257/401 |

OTHER PUBLICATIONS

Nesbit, L.A., "Method of Forming Shallow Trench Isolation with Selectively Doped Sidewalls", IBM Tech. Disc. Bulletin vol. 31, No. 2, Jul. 1988, pp. 418–420.

Wen, D. S., "Optimized Shallow Trench Isolation Structure and Its Process for Eliminating Shallow Trench Isolation–Induced Parasitic Effects", IBM Tech. Disc. Bulletin vol. 34, No. 11, Apr. 1992, pp. 276–277.

*Primary Examiner*—Nâgan V. Ngô
*Attorney, Agent, or Firm*—Whitham, Curtis & Whitham; Eric W. Petraske, Esq.

[57] ABSTRACT

A field effect transistor (FET) device, which mitigates leakage current induced along the edges of the FET device, is isolated by shallow trench isolation having a channel width between a first and a second shallow trench at a first and second shallow trench edges. A gate extends across the channel width between the first and second shallow trenches. The gate has a first length at the shallow trench edges and a second length less than the first length between the shallow trench edges. The first length and the second length are related such that the threshold voltage, $V_t$, at the shallow trench edges is substantially equal to $V_t$ between the shallow trench edges. The gate structure of the FET device is produced using a unique phase shift mask that allows the manufacture of submicron FET devices with very small channel lengths.

3 Claims, 8 Drawing Sheets

METHOD TO SUPPRESS SUBTHRESHOLD LEAKAGE DUE TO SHARP ISOLATION CORNERS IN SUBMICRON FET STRUCTURES

CROSS REFERENCE TO RELATED APPLICATION

This application is a continuation of application Ser. No. 08/274,055 filed Jul. 12, 1994, now abandoned.

BACKGROUND OF THE INVENTION

1. Field of the Invention

The present invention generally relates to the manufacture of field effect transistor (FET) devices and, more particularly, to an improved isolation design which mitigates leakage current induced along the edges of an FET device, especially submicron FET devices using shallow trench isolation, and a unique phase shift mask used for making the FET device.

2. Description of the Prior Art

Metal oxide semiconductor field effect transistor (MOSFET) devices using deep or shallow trench isolation exhibit high off-current leakage, due to field enhanced lowering of threshold voltage, $V_t$, at the isolation corners.

Simulated threshold roll-off of devices using two different isolation structures is shown in FIG. 1. The simulated data shown in FIG. 1 was generated assuming that everything else remains the same, such as the same implant condition, oxide thickness, work function, etc. The device using recessed oxide isolation (top curve) has the highest threshold voltage, $V_t$. Its long channel (channel length>0.4μ) $V_t$ is in the range of 0.6–0.8V. The lower curve is for a device with planar shallow trench isolation. Its long channel $V_t$ is in the range of 0.4–0.6V.

One method of achieving acceptable off-current is by increasing the $V_t$ by tailored implant to the channel of the FET, particularly along the channel edges that abut the isolation region. However, such an approach results in increased $V_t$ away from the corners as well as at the corners, with a resultant loss of current drive.

SUMMARY OF THE INVENTION

It is therefore an object of the present invention to provide a solution to the problem of leakage current induced along the channel edges of FET devices by sharp isolation corners of the silicon in which the FET devices are fabricated.

It is another object of the invention to provide a unique mask design which is especially useful in the manufacture of submicron FET devices and, in particular, permits a complete definition of the gate structure according to the invention with a single exposure.

It is a further object of the invention to provide a method for fabricating a two gate structure which minimizes the leakage current in submicron FET devices.

According to the invention, minimizing corner gate conduction is accomplished by using a gate layout which increases the channel length where the gate crosses over the edge. The rest of the gate is maintained at the designed gate length. This design guarantees a threshold voltage, $V_t$, in the range of 0.5–0.6V at the corners if corner device channel length is about 0.45μm. The bulk device has a $V_t$ in the range of 0.6–0.7V if channel length is 0.25μm. Since a minimum overlay dimension of the longer gate length of the boundaries must be kept at both ends of the device, there is a trade-off with device packing density. These devices can be used for those applications where performance is more important than density.

According to one aspect of the invention, a phase shift mask is used to define the resist pattern for the main gate structure. This phase shift mask results in a main gate structure which is a very small dimension especially suited to submicron devices. It is, however, this very small dimension which gives rise to the problem of leakage current at the locations where the channel edges abut the isolation structure. The invention provides a unique fabrication method which avoids the leakage current problem, which fabrication method can be used for making two FET devices or an FET device with two gates.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
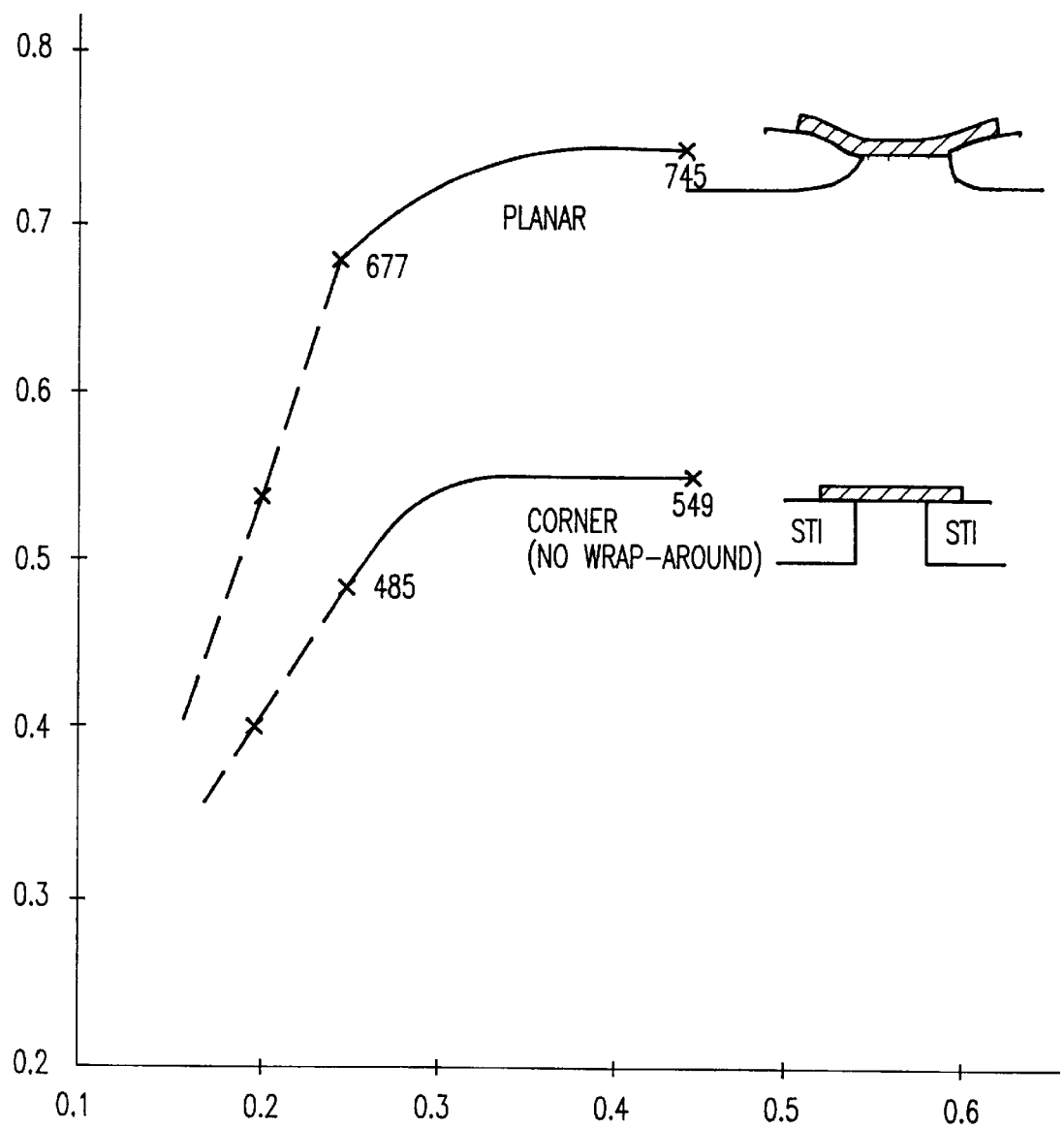
FIG. 1 is a graph showing the $V_t$ roll-off curves for two different field effect transistor (FET) devices with different isolation structures.
Figure 2:
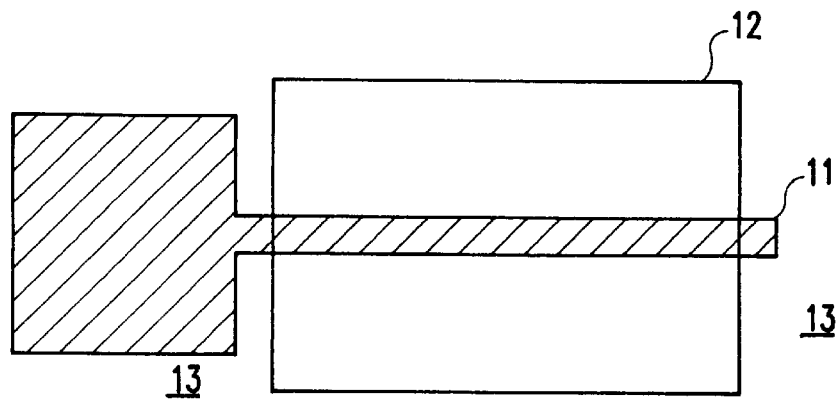
FIG. 2 is a plan view showing the layout of a conventional FET device.
Figure 3:
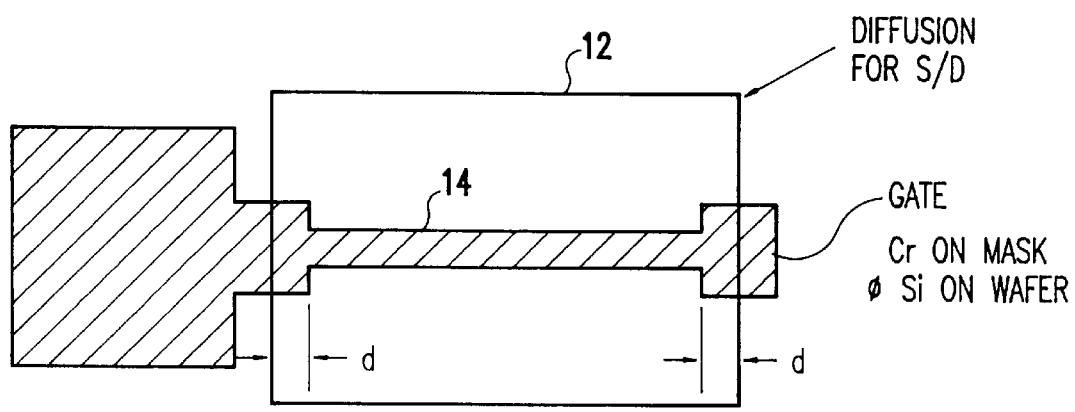
FIG. 3 is a plan view showing the layout an FET device according to the invention.

Referring now to the drawings, and more particularly to FIG. 2, there is shown the layout of a conventional FET device wherein a gate 11 is formed over a diffusion region 12 which serves as the source and drain of the FET device. The diffusion region 12 is surrounded by an isolation region, generally denoted by the reference numeral 13. FIG. 3 shows the layout of an FET device according to a preferred embodiment of the invention. As can be seen in this figure, the gate 14 is enlarged at either end so that the channel length is increased where the gate crosses over the diffusion edge. In a preferred embodiment of the invention, the isolation regions 13 comprises shallow trenches having a depth of between 0.1–0.5μ.

One method of achieving the layout shown in FIG. 3 is to use a straight-forward mask design with longer gate length at the ends of the device or where the gate crosses over the isolation region, which is also the same at the edge of the gate or boundary gate. Another approach, and the one taken by this invention, is to use a phase shift mask that contains phase edge patterns in a transparent material to form the main (i.e., shorter) gate and opaque patterns for the boundary (i.e., longer) gate and contact. Since a minimum overlay dimension of the longer gate length of the boundaries must be kept ("d" as shown in FIG. 3) at both ends of the device, there is a trade-off of device packing density.

Figure 4A:
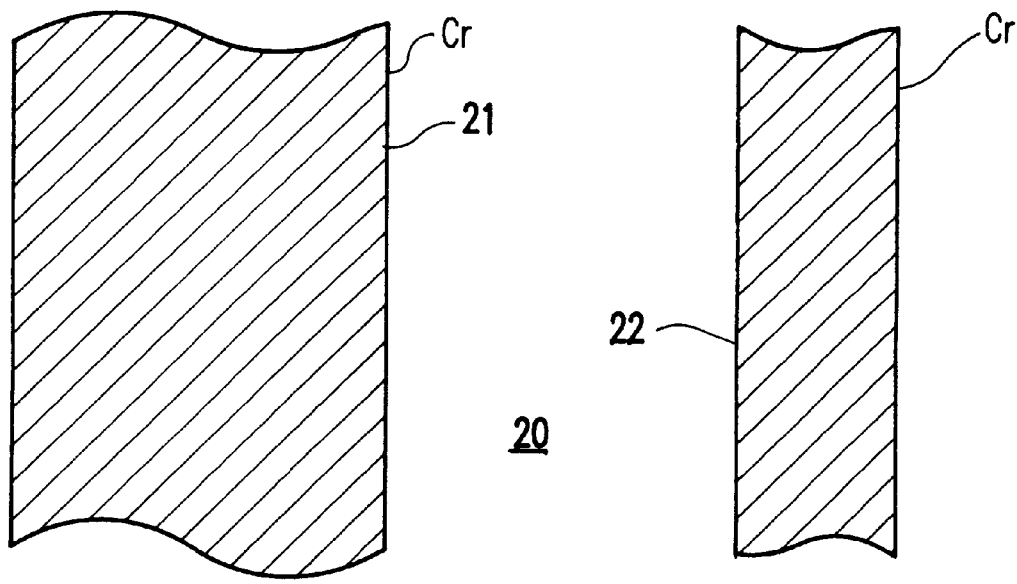
FIGS. 4A to 4C show, in plan view, the steps for fabricating the novel mask to produce two FET gates according to one aspect of the invention.
Figure 4B:
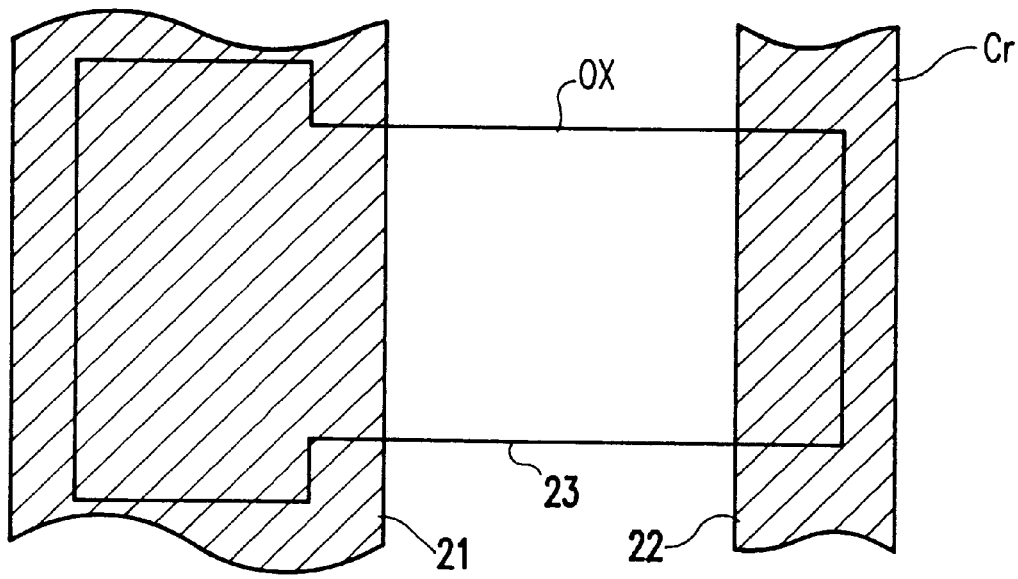
Figure 4C:
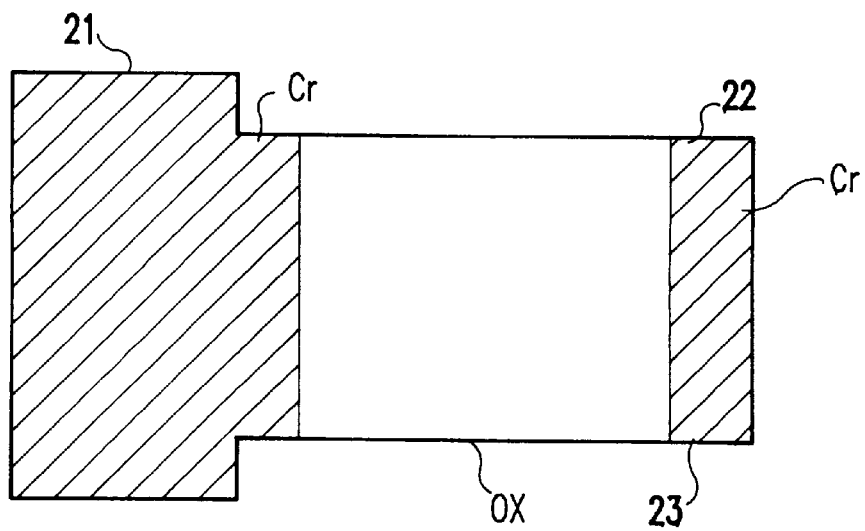

FIGS. 4A to 4C show, in plan view, the process for making the novel mask used to manufacture FET devices according to one aspect of the invention. In the first step, shown in FIG. 4A, two stripes 21 and 22 of an opaque material are formed on a transparent substrate, such as a quartz plate, generally denoted by the reference numeral 20, to be used as a mask. The opaque material may be, for example, chromium (Cr). Next, a transparent film is applied to the substrate. The transparent film may be, for example, a chemical vapor deposited (CVD) blanket of silicon dioxide ($SiO_2$). This film is then patterned by etching, such as a reactive ion etch (RIE), to form the phase shift pattern 23 shown in FIG. 4B. To complete the mask for fabricating FET devices according to a preferred embodiment of the invention, the chrome stripes are etched to the pattern 23 as shown in FIG. 4C. Notice from FIG. 4C that the chrome and phase shift patterns are thus formed in a self-aligned manner.

Figure 4D:
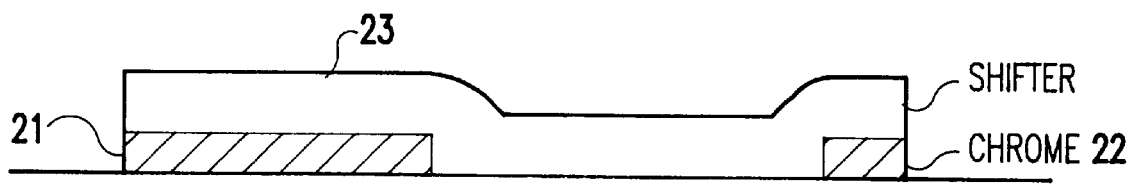
FIG. 4D is a cross-sectional view of the mask shown in FIG. 4C.

To summarize, the mask fabrication process is as follows. The chrome pattern is defined first. A 180° phase shifter, such as chemical vapor deposit (CVD) oxide, is then deposited to a thickness of approximately 245 nm (2450 Å). This thickness produces the 180° phase shift at the edges of the pattern for later deep ultraviolet (DUV) exposure. The thickness will vary according to the wavelength of the exposure radiation; that is, if shorter wavelengths are used for exposure, then the thickness of the film required to produce a 180° phase shift will be less and, conversely, if longer wavelengths are used, the thickness will be greater. After the phase shifter patterns are defined, the phase shifter patterns are used as a mask to further trim the chrome patterns such that chrome is presented only under the phase shifter patterns as shown in FIG. 4C. The cross-sectional view of the mask produced in FIG. 4C is shown in FIG. 4D.

Figure 5A:
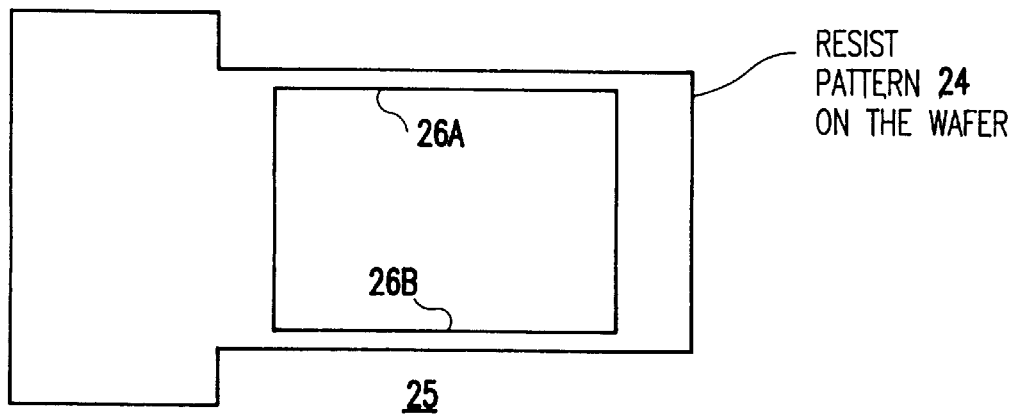
FIGS. 5A to 5D show, in plan view, the process of manufacturing FET devices using the mask of FIG. 4C according to the invention.

This mask is used to form the resist pattern 24 on the silicon wafer 25 shown in FIG. 5A. As may be appreciated from FIG. 5A, the main gate structures 26A and 26B are quite narrow since they are defined by the phase edge of the $SiO_2$ on the mask shown in FIG. 4C.

Figure 5B:
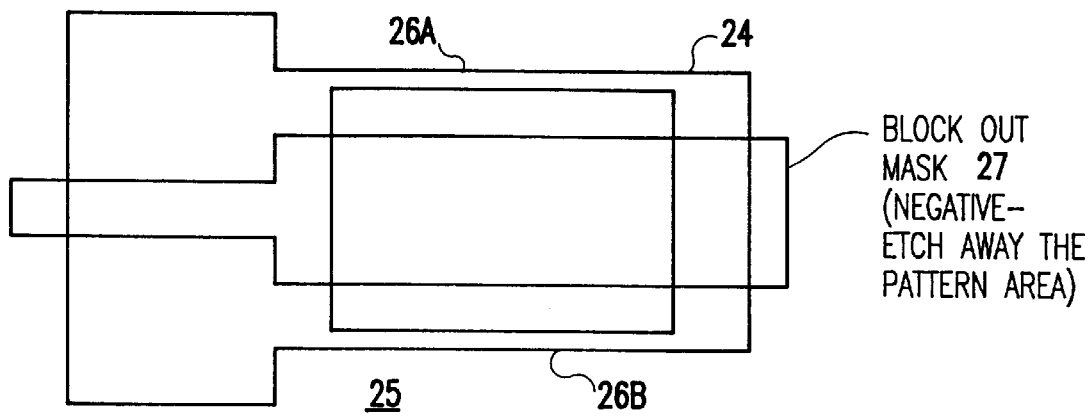
Figure 5C:
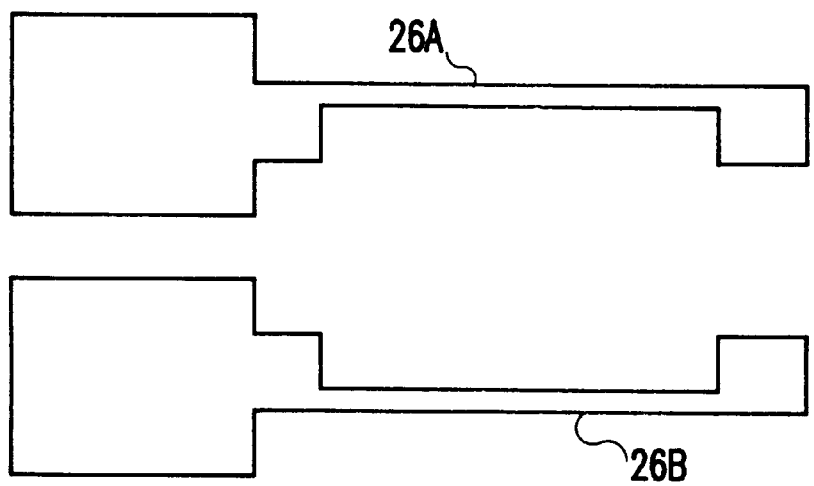
Figure 5D:
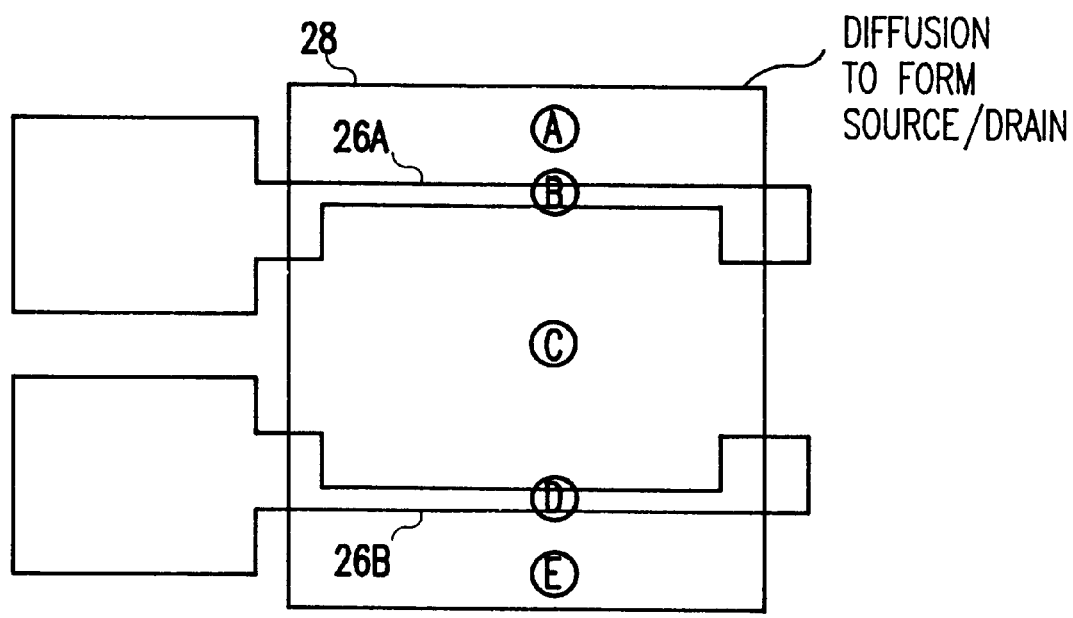
Figure 6:
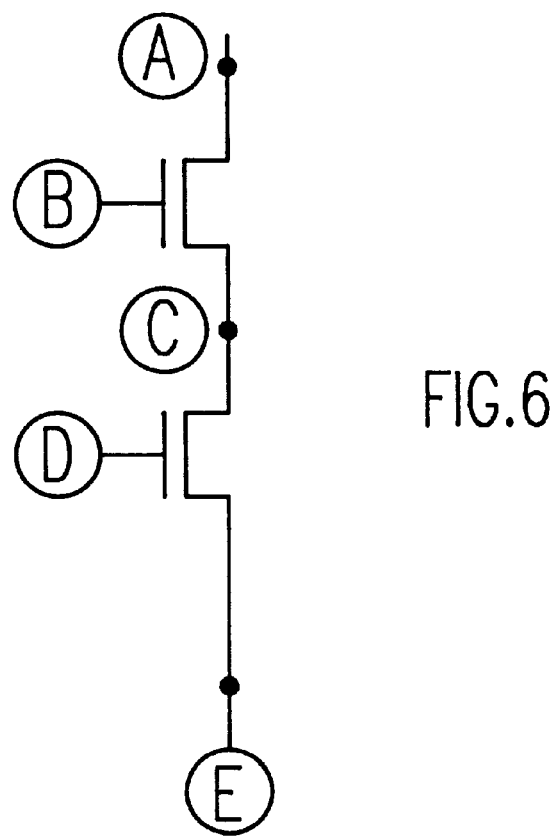
FIG. 6 is a schematic diagram of the equivalent circuit of the device shown in FIG. 5D.

If a single gate device is desirable, a block out mask is needed to separate the gates. This block out mask 27 is shown in FIG. 5B as a negative (i.e., the pattern area of the mask is etched away). The resulting structure is shown in FIG. 5C. This structure is essentially the same as that shown in FIG. 3 where the gate structures 26A and 26B are enlarged at either end. As long as the gate length at the boundaries are maintained longer than 0.35 µm, a $V_t$ greater than 0.5V will be established. FIG. 5D is the same as that of FIG. 5C but additionally illustrates the diffusion region 28 which forms the sources and drains of the two FET devices. The resulting circuit is shown in FIG. 6 and comprises the two FET devices connected in cascade with a common source/drain region C. The other parts of the structure shown in FIG. 5D which correspond to the circuit shown in FIG. 6 are denoted by the nodes A, B, D, and E.

Figure 7:
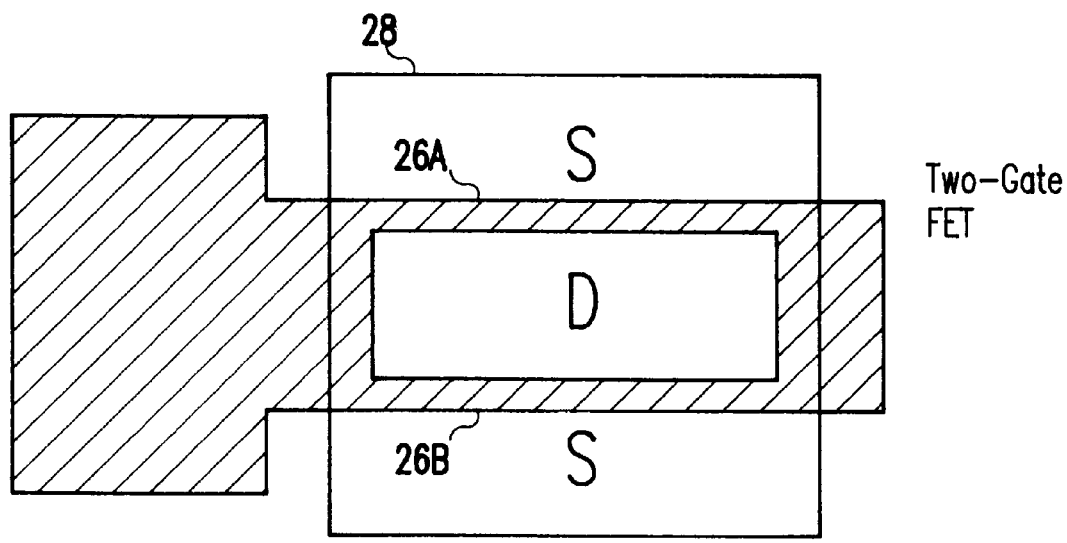
FIG. 7 is a plan view showing an alternative two-gate FET device fabricated according to the invention.
Figure 8:
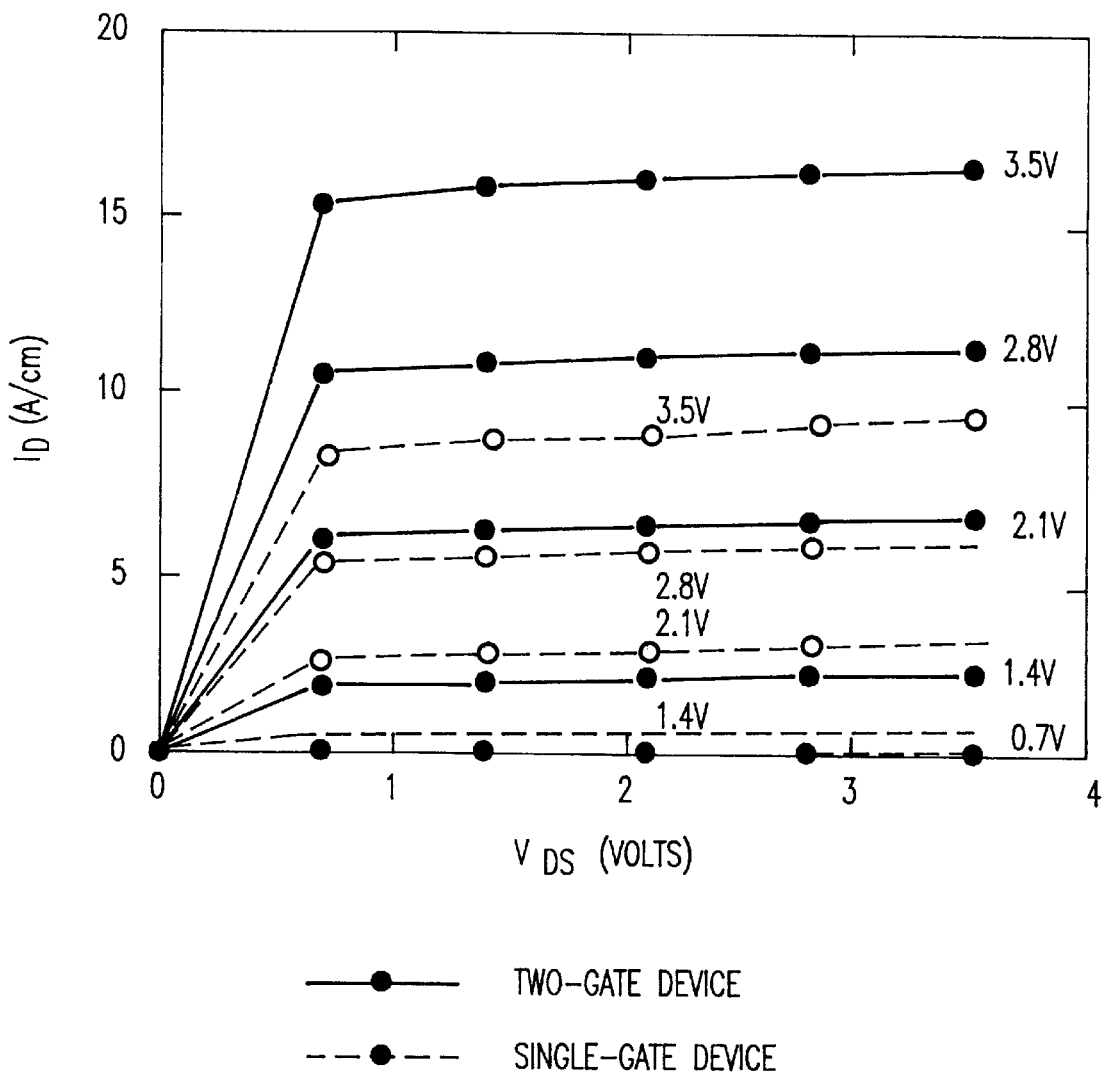
FIG. 8 is a graph showing the current-voltage (I-V) characteristics of single and two-gate devices fabricated according to the invention.

A two-gate device can be easily designed and fabricated using a phase-edge mask without a block out mask. The process uses the same mask as shown in FIG. 4C to form the pattern in the wafer shown in FIG. 5A; however, the block out mask 27 shown in FIG. 5B is not used. Final structure of a two-gate device is shown in FIG. 7. The drain contact is located at the middle and source contacts are on both sides. This device will give about two times of current drive compared to a structure having only one gate. Simulated current-voltage (I-V) characteristics for both single and two-gate devices are shown in FIG. 8. A two-gate layout is very useful, especially in driver design and high-voltage applications.

In summary, the invention provides several advantages when fabricating submicron FET devices. First of all, a unique mask structure is provided which uses $SiO_2$ patterned on a transparent substrate, such as a quartz plate. The edges of the $SiO_2$ patterns produce a 180° phase shift in UV light used to expose a resist on a silicon wafer during the lithographic exposure, resulting in very narrow channel lengths. Moreover, this mask, which includes opaque chromium areas to define enlarged channel lengths at either end of the gate, allows a complete definition of the gate structure with a single exposure and, in addition, permits the direct production of a two-gate structure. Finally, the fabrication of the mask is facilitated by the self-aligned structure of the $SiO_2$ and chromium patterns.

While the invention has been described in terms of several aspects of a single preferred embodiment, those skilled in the art will recognize that the invention can be practiced with modification within the spirit and scope of the appended claims.

Having thus described our invention, what we claim as new and desire to secure by Letters Patent is as follows:

1. A field effect transistor isolated by shallow trench isolation devoid of local oxidation of silicon (LOCOS) isolation, said shallow trench isolation having a channel width between first and second shallow trenches at first and second shallow trench edges and a gate which extends across said channel width between said first and second shallow trenches, said gate having a first length at said shallow trench edges and a second length less than said first length between said shallow trench edges, said first length and said second length being related such that a threshold voltage, $V_t$, at said shallow trench edges is substantially equal to $V_t$ between said shallow trench edges.

2. The field effect transistor recited in claim 1 wherein the first and second shallow trenches have a depth of between 0.1–0.5µ.

3. The field effect transistor recited in claim 1 wherein the channel length is between 0.25 µm and 0.45 µm and $V_t$ is between 0.67V and 0.55V.

* * * * *